US006720130B1

(12) United States Patent
Zhong et al.

(10) Patent No.: US 6,720,130 B1
(45) Date of Patent: Apr. 13, 2004

(54) RADIATION SENSITIVE LITHOGRAPHIC PRINTING PLATE PRECURSORS HAVING ABLATION-FREE IMAGEABLE COMPOSITION AND METHOD

(75) Inventors: Xing-Fu Zhong, Wallington, NJ (US); Shashikant Saraiya, Parlin, NJ (US); S. Peter Pappas, Juno Beach, FL (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 10/266,888

(22) Filed: Oct. 8, 2002

(51) Int. Cl.$^7$ .............. G03F 7/16; G03F 7/11; G03F 7/36
(52) U.S. Cl. ............ 430/273.1; 430/302; 430/964; 101/462; 101/467
(58) Field of Search ................ 430/273.1, 302, 430/964; 101/462, 467

(56) References Cited

U.S. PATENT DOCUMENTS

| 5,985,515 | A | 11/1999 | Van Rompuy et al. .. 430/272.1 |
| 6,107,001 | A | 8/2000 | Lewis et al. ................ 430/302 |
| 6,210,857 | B1 * | 4/2001 | Vermeersch et al. ..... 430/270.1 |
| 6,378,432 | B1 * | 4/2002 | Lewis ........................ 101/467 |
| 6,397,749 | B1 | 6/2002 | Kita et al. .................. 101/457 |

FOREIGN PATENT DOCUMENTS

| EP | 1 110 719 A2 | 12/2000 |
| EP | 1 065 049 A1 | 1/2001 |
| EP | 1 065 052 A1 | 1/2001 |
| EP | 1 065 053 A1 | 1/2001 |
| WO | WO 00/12948 | 3/2000 |
| WO | WO 01/02787 A1 | 1/2001 |
| WO | WO 01/02788 A1 | 1/2001 |

* cited by examiner

Primary Examiner—Richard L. Schilling
(74) Attorney, Agent, or Firm—Faegre & Benson LLP

(57) ABSTRACT

The present invention relates to a negative-working radiation imageable lithographic printing plate precursor, preferably having only two polymeric layers on a support. The first (bottom) layer is composed of oleophilic polymers and a photothermal converter which converts radiation to heat. The second polymeric layer (top) is composed of crosslinked hydrophilic polymers which absorb aqueous fountain solution and repel ink. The oleophilic polymers in the first layer contain functional groups are interlayer chemically bonded to the hydrophilic polymer in the second layer to provide interlayer adhesive bonding between the two layers.

The plate is imagewise exposed to radiation, such as with an IR laser, resulting in non-ablative adhesion-weakening between the two layers so that the plate can be developed by fountain solution and/or ink on press whereby the top layer in the exposed area is removed on the press to reveal the ink-receptive image area. The top layer in the unexposed area remains as the non-image area.

47 Claims, No Drawings

RADIATION SENSITIVE LITHOGRAPHIC PRINTING PLATE PRECURSORS HAVING ABLATION-FREE IMAGEABLE COMPOSITION AND METHOD

BACKGROUND OF THE INVENTION

1. Field of the Invention

The present invention relates to a heat-sensitive lithographic printing plate precursor, which requires no development-processing and can ensure a long press life and high stain resistance. More specifically, the present invention relates to a lithographic printing plate precursor which enables non-ablative recording of images by scanning exposure to radiation, such as infrared laser beams based on digital signals and, after the images are recorded therein, can be mounted in a printing machine (i.e. a printing press) without undergoing development-processing, and subjected to printing operations.

2. State of the Art

Various methods have been proposed concerning a lithographic printing plate precursor of the kind which enables image formation by heat and can be mounted in a printing machine without development-processing after the image formation. One method among them is a method of utilizing an ablation phenomenon, which comprises exposing a printing plate precursor containing a compound capable of converting light to heat by means of a high-output solid-state laser, e.g., a semiconductor laser or a YAG laser, to make the exposed area evolve heat by the compound capable of converting light to heat, thereby causing decomposition and evaporation, namely ablation, in the exposed area.

In negative-working compositions, a water-receptive layer is provided on a substrate having an oleophilic ink-receptive layer and the water-receptive layer is removed by ablation.

Reference is made to U.S. Pat. No. 6,397,749 and EP 1,110,719, both assigned to Fuji Photo Film, Ltd. which disclose heat sensitive lithographic printing plate precursors for on-press development, having a substrate supporting an ink-receptive or oleophilic layer and having thereover a crosslinked hydrophilic layer. In U.S. Pat. No. 6,397,749, a third water soluble overcoat layer is further provided to facilitate development on press.

Reference is also made to published EP Patent Applications 1,065,049 to 1,065,053 and to U.S. Pat. No. 5,985,515, all assigned to AGFA-Gevaert, N.V. These references also disclose heat-imageable lithographic printing plates having a support, a heat-sensitive oleophilic layer and a hydrophilic top layer containing a cross-linked hydrophilic polymer. In U.S. Pat. No. 5,985,515 and EP 1,065,052, the hydrophilic layer is heat-ablatable.

In EP 1,110,049 the hydrophilic layer contains heat-meltable, dispersed hydrophobic polymer particles which melt to form hydrophobic, oleophilic image areas. In EP 1,110,050 the thickness of the heat-sensitive oleophilic layer is regulated to permit the hydrophilic properties of the hydrophilic support to reduce toning in the non-imaged areas of the plate and thereby increase the run length of the imaged plate. In EP 1,110,051, the two-layer heat-sensitive material is covered by a third hydrophilic layer comprising an organic compound containing cationic groups.

A major disadvantage of ablation processes is contamination of the imaging device. Vacuum cleaning systems are generally required to avoid such contamination. Another disadvantage is that the decomposition of the plate layer(s) in the exposed areas results in the scattering of scum particles produced during decomposition, which scum particles attract printing ink to the non-image areas of the developed plate surface, resulting in background staining of the printed copies. This is alleviated to some extent by the application of a water-soluble overcoat layer.

It is also known in U.S. Pat. No. 6,107,001 to Presstek Inc., dated Aug. 22, 2000, to avoid the disadvantages of ablation or decomposition of the plate layers in the heat developed image areas by providing two layers, such as a hydrophilic top layer and an oleophilic bottom layer, the top layer becoming irreversably-debonded from the bottom layer in the heat-imaged areas.

None of the above cited references discloses interlayer chemical bonding between the hydrophilic and oleophilic layers.

SUMMARY OF THE INVENTION

The present invention relates to a radiation sensitive lithographic printing plate precursor preferably having only two polymeric layers on a support. The first (bottom) layer is composed of oleophilic polymer(s) and a photothermal converter which converts radiation to heat. The second polymeric layer (top) is composed of crosslinked hydrophilic polymer(s) which absorb aqueous fountain solution and repel ink. The oleophilic polymer(s) in the first layer contain functional groups, which chemically bond with the second layer to provide interlayer adhesive bonding between the two layers.

The plate is imagewise exposed to electromagnetic radiation, such as with an IR laser, resulting in non-ablative weakening of the adhesive bonding between the two layers so that it can be developed by fountain solution and/or ink on press. After development, the top layer in the exposed area is removed to reveal the underlying ink-receptive image area. The top layer in the unexposed area remains as non-image area.

The top hydrophilic layer has an opposite affinity for printing ink or ink-adhesive fluid from the heat-sensitive oleophilic, hydrophobic layer therebeneath. Preferably, both the top and bottom layers remain in place after the plate precursor is heat-imaged with no ablation of either layer. Any detachment of the top layer from the bottom layer in the heat-images areas is reversible to some extent by heating to elevated temperatures, as described in the examples.

DETAILED DESCRIPTION OF THE PREFERRED EMBODIMENT(S)

The novel lithographic printing plate precursors of the present invention comprise:

(1) a substrate, which is dimensionally stable and can be aluminum or another metal or alloy. Preferentially electrochemically and/or mechanically grained and anodized aluminum is used in the present invention. Hydrophilization of the aluminum substrate is not required, but may be useful for enhancing adhesion of the base layer to the substrate.

Furthermore in connection with the present invention, the support can be a flexible support. As flexible support in connection with the present embodiment it is particularly preferred to use a polymeric film e.g. substrated polyethylene terephthalate film, polyethylene naphthalate film, cellulose acetate film, poly-styrene film, polycarbonate film, polyethylene film, polypropylene film, polyvinyl chloride film, polyether sulphone film. The plastic film support may be opaque or transparent. The polymeric film is preferably subbed with subbing layers as described in EP-A-619 524, EP-A-619 525 and EP-A-620 502.

Still further paper or glass of a thickness of not more than 1.2 mm can also be used.

(2) an olephilic base layer comprising an oleophilic polymer containing functional reactive groups, and a photothermal converter material, such as dye or pigment capable of absorbing electromagnetic radiation and converting it to heat, and (3) a hydrophilic overlayer comprising a crosslinked hydrophilic polymer capable of absorbing aqueous lithographic fountain solution, in which said crosslinked hydrophilic polymer is interlayer chemically bonded with the functional reactive groups of said oleophilic polymer in the base layer to provide interlayer adhesive bonding between said layers, imagewise exposure of said printing plate precursor to laser radiation resulting in non-ablative weakening of said adhesive bonding between said layers in the exposed areas whereby said hydrophilic overlayer can be removed by fountain solution or ink on a lithographic printing press to reveal the oleophilic ink-receptive base layer.

Preferably the oleophilic polymer of the base layer composition and the crosslinkable hydrophilic polymer of the overlayer or top layer are both organic polymers.

Suitable oleophilic organic polymers for the base layer include acrylic polymers and copolymers, methacrylic polymers and copolymers, epoxy polymers, phenolic polymers, polyurethanes, polyureas and polyesters, most preferably such polymers contain at least one of —COOH and —OH functional reactive groups.

Suitable acrylic and methacrylic copolymers include copolymers with styrene, maleic acid, fumaric acid, itaconic acid and 2-carboxyethyl acrylate.

The oleophilic base layer is applied to the substrate at a coating weight, after drying, preferably within the range of about 0.8 to about 5.0 g/m$^2$, more preferably about 1.0 to about 3.5 g/m$^2$ and most preferably about 1.5 to about 3.0 g/m$^2$. Lower coating weights of the bottom layer tend to reduce press life of the plates. The radiation-sensitive oleophilic layer comprises an oleophilic binder and a photothermal converter material capable of converting electromagnetic radiation into heat.

Suitable photothermal converters absorb UV, visible or infrared radiation and convert the absorbed radiation into heat. Preferred photothermal converter materials absorb radiation in the near infrared region in the range of about 800–1200 nm, more preferably in the range of about 810–900 nm. Useful compounds are for example dyes and in particular infrared dyes as disclosed in EP-A-908 307 and pigments, in particular infrared-absorbing pigments such as carbon black, metal carbides, borides, nitrides, carbonitrides, bronze-structured oxides and oxides structurally related to the bronze family but lacking the A component e.g. $WO_{2.9}$. It is also possible to use conductive polymer dispersions such as polypyrrole or polyaniline-based conductive polymer dispersions. The lithographic performance and in particular the print endurance obtained depends i.a. on the heat-sensitivity of the imaging element. In this respect it has been found that carbon black yields useful results. Most preferred photothermal converter materials are cyanine dyes.

Suitable hydrophilic organic polymers for the overlayer or top layer include hydroxy-functional polymers, carboxylic acid-functional polymers, sulfonic acid-functional polymers, amido-functional polymers and sulfonamido-functional polymers.

Preferred hydroxy functional hydrophilic polymers are selected from the group consisting of polyvinyl alcohol, a silanol-functional polyvinyl alcohol, a methacrylamido-functional polyvinyl alcohol, a sulfate-functional polyvinyl alcohol, an acrylic polymer, a methacrylic polymer, a polyester and mixtures thereof.

Preferred carboxy functional hydrophilic polymers are selected from the group consisting of polyacrylic acid, polymethacrylic acid, copolymers thereof and mixtures thereof.

Preferred amido functional hydrophilic polymers are selected from the group consisting of polyacrylamide, polymethacrylamide, copolymers thereof and mixtures thereof.

The crosslinked hydrophilic polymer of the overlayer or top layer preferably is formed from a crosslinkable hydrophilic polymer and a crosslinking agent which is further reactive with the functional reactive groups of the oleophilic polymer of the base layer. Suitable crosslinking agents will depend upon the specific hydrophilic polymer used in the top layer, and include a polyvalent metal salt, a polyvalent metal complex, an amino resin crosslinking agent, an amido resin crosslinking agent, an aldehyde crosslinking agent, an alkoxysilane crosslinking agent and a combination thereof. Preferably the polyvalent metal salt or said polyvalent metal complex contains a metal selected from the group consisting of magnesium, aluminum, calcium, titanium, ferrous, cobalt, copper, strontium, zinc, zirconium, stannous and stannic, most preferably a zirconium (IV) salt.

The hydrophilic top layer is applied over the oleophilic base layer at a coating weight, after drying, preferably within the range of about 0.5 to about 5.0 g/m$^2$, more preferably about 0.8 to about 3.5 g/M$^2$, most preferably about 1.0 to about 2.5 g/m$^2$.

Most preferably, the printing plate precursor is one in which the oleophilic polymer comprises carboxylic acid groups, the hydrophilic polymer comprises hydroxy groups and the crosslinker is a zirconium (IV) salt or complex.

The oleophilic base layer can be applied to the substrate using application methods known in the art. For example, the components of the base layer, including an oleophilic polymer containing functional reactive groups and a photothermal converter, can be dissolved or dispersed in solvents, preferably organic solvents, and applied to an aluminum substrate, which has been preferably grained and anodized. Preferably the components of the base layer are dissolved in organic solvents. In a preferred embodiment the base layer coating solution is free of dispersed particles.

The hydrophilic top layer can be applied to the oleophilic base layer using application methods known in the art. For example, the components of the top layer, including a crosslinkable hydrophilic polymer, capable of interlayer chemical bonding with the oleophilic polymer in the base layer, can be dissolved or dispersed in solvents, preferably aqueous solvents. More preferably the components of the top layer are applied in water. In a preferred embodiment the top layer coating solution is free of dispersed particles.

After drying, the crosslinkable hydrophilic polymer in the top layer is crosslinked by the application of energy, which may be in the form of heat or electromagnetic radiation. The hydrophilic polymer in the top layer is also interlayer chemically bonded with the oleophilic polymer in the base layer to provide interlayer adhesive bonding. Interlayer chemical bonding is preferably covalent bonding, i.e. bonding involving the formation of interlayer covalent chemical bonds. Although generally weaker, interlayer electrostatic bonding, by attraction of unlike charges, and interlayer hydrogen bonding may also provide sufficient interlayer adhesive bonding.

Preferably, the top layer includes a crosslinker capable of crosslinking the hydrophilic polymer, as well as being capable of interlayer chemically bonding the hydrophilic polymer in the top layer with the oleophilic polymer in the base layer, by application of heat. In this case, sufficient heat is applied to accomplish the desired extent of crosslinking and interlayer chemical bonding, typically involving cure conditions with temperatures in the range of about 90 to about 160° C., preferably about 120 to about 135° C., and cure times in the range of about 0.5 to about 5 min, preferably about 1 to about 2 min.

The printing plate precursor can have additional layers, such as an underlying layer or an overlying layer. For example, an underlying layer may be useful for enhanced adhesion to the substrate. An overlying layer may be useful to prevent damage, such as scratching of the hydrophilic layer, and also to promote on-press developability. Preferably, the printing plate precursor is free of additional layers in order to enhance the efficiency and reduce the cost of manufacture.

The printing plate precursor is imagewise exposed with laser radiation, preferably in the near infrared region, for example, using a semiconductor laser or YAG laser, to selectively weaken the interlayer adhesive bonding between the oleophilic base layer and the hydrophilic top layer, non-ablatively, in the exposed areas. Some extent of non-ablative decomposition may also occur in the top layer during imagewise exposure. Following imagewise exposure, the imaged plate precursor can be mounted on a printing press, without an additional processing step, and contacted with fountain solution and ink, which selectively removes the hydrophilic top layer, thereby revealing the oleophilic base layer in the exposed areas, while retaining interlayer adhesive bonding in the unexposed areas, so that the resulting printing plate is capable of long press runs without background contamination of the printed copies.

Alternatively, the imaged plate precursor may be contacted with an aqueous solution prior to mounting on a printing press. Such treatment with an aqueous solution may involve dipping, wiping or brushing with an aqueous solution, such as a fountain solution. The following examples are given by way of illustration and should not be considered limitative.

EXAMPLE 1

A 22.8% solution of poly(methyl methacrylate)-co-poly (methacrylic acid) copolymer (80% MMA and 20% MAA) (37.2 g) in methyl ethyl ketone (MEK) was diluted with 60 g of MEK and 20 g of 2-methoxyethanol (MC). Near IR absorbing dye, 2-[2-[chloro-3-[(1,3-dihydro-1,1,3-trimethyl-2H-benz[e]indol-2-ylidene)ethylidene]-1-cyclohexene-1-yl]etheny]-1,1,3-trimethyl-1H-benz[e] indolium, salt with 4-methylbenzenesulfonic acid, (TIR dye) (1.5 g) was added. The solution was spin coated onto aluminum substrates, which were electrochemically grained, anodized and hydrophilized with polyvinyl phosphonic acid, at 100 rpm for 3 min, to provide a first layer of about 2.5 g/m² coating weight, after drying.

A polyvinyl alcohol solution (31.2 g), consisting of 6.5% Airvol 125 (available from Air Products) in water, was further diluted with 48 g of water. Triton X-100 (0.15 g) and ammonium zirconium carbonate (29% solution) (3.1 g) were added. The solution was spin coated on top of the bottom layer at 100 rpm for 5 min, to provide a top layer of about 1.5 g/m² coating weight, after drying. The coating was cured at 145° C. for 5 min.

The plates were imagewise exposed in a Creo Trendsetter at 830 nm with a power setting of 10.75 W and a dose of 500 mJ/cm². Without further processing, the plates were mounted on a Heidelberg Quickmaster press. Good quality prints were obtained after a few initial revolutions (less than 20).

EXAMPLE 2

Example 1 was repeated except that the poly(methyl methacrylate)-co-poly(methacrylic acid) copolymer in the bottom layer consisted of 90% MMA and 10% MAA. A 22.3% solution of this copolymer (38.1 g) in MEK was diluted, as described in Example 1, TIR dye (1.5 g) was added and the solution was spin coated onto aluminum substrates, as described in Example 1, to provide a coating weight of 2.2 g/m².

Following application of the top layer, as described in Example 1, the plates were imagewise exposed as described in Example 1, except that the exposure dose was 350 mJ/cm². Without further processing, the plates were mounted on a Heidelberg Quickmaster press. Good quality prints were obtained after a few initial revolutions (less than 20).

EXAMPLE 3

Example 1 was repeated except that the poly(methyl methacrylate)-co-poly(methacrylic acid) copolymer in the bottom layer was replaced with a poly(methyl acrylate)-co-poly(methyl methacrylate)-copoly(acrylic acid) (25% MA, 59% MMA, 16% AA) copolymer. The copolymer (14.9 g) and TIR dye (2.6 g) were dissolved in MEK (163 g) and MC (70 g) and spin coated onto aluminum substrates, as described in example 1, to provide a coating weight of 2.5 g/m².

After application of the top layer (coating weight 1.6 g/m²), as described in Example 1, the plates were imagewise exposed as described in Example 1, except that the exposure dose was varied over the range of 200–550 mJ/cm². When on-press development was simulated with an ink/water mixture, using an ink roller, good quality images were obtained for exposure doses equal to or greater than about 300 mJ/cm².

EXAMPLE 4

(Comparative) Example 1 was repeated except that the poly(methyl methacrylate)-co-poly(methacrylic acid) copolymer in the bottom layer was replaced with polymethyl methacrylate (8 g), which, together with TIR dye (2 g), was dissolved in MEK (60 g) and MC (20 g).

Following application of the top layer, as described in Example 1, the plates were imagewise exposed and developed, as described in Example 3. However, in contrast to the results in Example 3, good quality prints could not be obtained. A weak image was obtained, which may be attributed to poor adhesion between the 2 layers.

EXAMLE 5

Imagewise exposed plates of Example 2 were heated to 80° C. and 120° C. for 16 hours followed by development with an ink/water mixture, as described in Example 3. Plates heated at 120° C. could not be developed except in the 100% solid area and partly in the 95% area. Plates heated at 80° C.

could be developed, but lower resolution was obtained as compared to the unheated plate.

EXAMPLE 6

Imagewise exposed plates of Example 3 were heated and developed, as described in Example 5. The plate heated at 120° C. could not be developed at all, signifying that the imaging in completely reversible. The plate heated at 80° C. could not be developed except in the 100% solid area and partly in the 95% area. Even unheated exposed plates showed reduction in developability after standing at room temperature for 16 hours which demonstrate room temperature reversibility.

EXAMPLE 7

Example 1 was repeated except that 0.5% triethylamine curing agent was added to the top coating solution. The coating was cured at 135° C. for 2 minutes.

Following application of the top layer, as described in Example 1, the plates were imagewise exposed as described in Example 1, except that the exposure dose was 460 mJ/cm$^2$. The plates were mounted on OMCSA press. Good quality prints were obtained.

EXAMPLE 8

Example 1 was repeated except that 0.5% ammonium hydroxide curing agent was added to the top coating solution. The coating was cured at 135° C. for 1.5 minutes.

Following application of the top layer, as described in Example 1, the plates were imagewise exposed as described in Example 1, except that the exposure dose was 420 mJ/cm$^2$. The plates were mounted on an OMCSA press. Good quality prints were obtained.

EXAMPLE 9

The first layer of Example 1 was replaced by the following formulation; 17 g of UR-4349 resin (a polyurethane, based on methylene diphenylisocyanate (MDI)/dimethylol propanoic acid (DMP) at 1:1 molar ratio, having a calculated acid number of 145) and 3 g of TIR dye were dissolved in 163.4 g of MeOH, 163.4 g of dioxalane and 53.2 g of methyl lactate.

The coating weight of the bottom layer is 2.5 g/m$^2$ and that of the top layer is 1.6 g/m$^2$. The plates were imagewise exposed to IR laser on Creo Trendsetter at 10.75 W and 200–550 mJ/cm$^2$. When developed with ink/water mixture using an ink roller, good quality image was obtained in areas exposed at 300 mJ/cm$^2$.

The present invention has been described with particular referenced to the preferred embodiments. It should be understood that variations and modifications thereof can be devised by those skilled in the art without departing from the spirit and scope of the present invention. Accordingly, the present invention embraces all such alternatives, modifications and variations and fall within the scopes of the appended claims.

What is claimed is:

1. A negative-working radiation imageable lithographic printing plate precursor comprising a substrate having thereon:
   (a) an oleophilic base layer comprising an oleophilic polymer containing functional reactive groups, and a photothermal converter material, and
   (b) a hydrophilic overlayer comprising a crosslinked hydrophilic polymer capable of absorbing aqueous lithographic fountain solution, in which said crosslinked hydrophilic polymer is interlayer chemically bonded with the functional reactive groups of said oleophilic polymer in the base layer to form an interlayer adhesive bond between said layers, exposure of said printing plate precursor to laser radiation resulting in non-ablative weakening of said interlayer adhesive bond between said layers whereby said hydrophilic overlayer can be removed by fountain solution or ink on a lithographic printing press to reveal the oleophilic base layer.

2. The printing plate precursor of claim 1, in which said oleophilic polymer in said base layer is interlayer covalently bonded with said hydrophilic polymer in said overlying layer.

3. The printing plate precursor of claim 1, in which said photothermal converter absorbs infrared radiation.

4. The printing plate precursor of claim 1, in which said photothermal converter is a cyanine dye.

5. The printing plate precursor of claim 1 in which said hydrophilic layer is free of a photothermal converter.

6. The printing plate precursor of claim 1 in which said crosslinked hydrophilic polymer is formed from a crosslinkable hydrophilic polymer and a crosslinking agent.

7. The printing plate precursor of claim 6 wherein said crosslinking agent is further reactive with said functional reactive groups of said oleophilic polymer.

8. The printing plate precursor of claim 1 which is free of additional layers.

9. The printing plate precursor according to claim 1 in which the oleophilic polymer of the base layer is an organic polymer or mixture of organic polymers.

10. The printing plate precursor of claim 6 in which the crosslinkable hydrophilic polymer of the overlayer is an organic polymer or mixture of organic polymers.

11. The printing plate precursor according to claim 9 in which the oleophilic polymer is selected from the group consisting of acrylic polymers and copolymers, methacrylic polymers and copolymers, epoxy polymers, phenolic polymers, polyurethanes, polyureas, polyesters, polyvinyl acetals and combinations thereof.

12. The printing plate precursor of claim 9 in which the oleophilic polymer is selected from the group consisting of acrylic polymers and copolymers, methacrylic polymers and copolymers, polyurethanes and combinations thereof.

13. The printing plate precursor according to claim 12 in which the oleophilic polymer contains at least one carboxylic acid group.

14. The printing plate precursor according to claim 10 in which said crosslinkable hydrophilic polymer is selected from the group consisting of hydroxy-functional polymers, carboxylic acid-functional polymers, sulfonic acid-functional polymers, amido-functional polymers and sulfonamido-functional polymers.

15. The printing plate precursor according to claim 14 in which the hydroxy functional polymer is selected from the group consisting of polyvinyl alcohol, a silanol-functional polyvinyl alcohol, a methacrylamido-functional polyvinyl alcohol, a sulfate-functional polyvinyl alcohol, a methacrylamido-functional polyvinyl alcohol, a sulfate-functional polyvinyl alcohol, an acrylic polymer, a methacrylic polymer, a polyester and mixtures thereof.

16. The printing plate precursor according to claim 14 in which the carboxylic acid-functional polymer is selected from the group consisting of polyacrylic acid, polymethacrylic acid, copolymers thereof and mixtures thereof.

17. The printing plate precursor according to claim 14 in which the amido-functional polymer is selected from the group consisting of polyacrylamide, polymethacrylamide, copolymers thereof and mixtures thereof.

18. The printing plate precursor according to claim 6 in which said crosslinking agent is selected from the group consisting of polyvalent metal salts, polyvalent metal complexes, amino resin-crosslinking agents, amido-resin crosslinking agents, aldehyde-crosslinking agents, alkoxysilane-crosslinking agents and combinations thereof.

19. The printing plate precursor according to claim 18 in which said polyvalent metal salt or said polyvalent metal complex contains a metal selected from the group consisting of magnesium, aluminum, calcium, titanium, ferrous, cobalt, copper, strontium, zinc, zirconium, stannous and stannic.

20. The printing plate precursor according to claim 19 in which said polyvalent metal salt or said polyvalent metal complex is a zirconium (IV) salt or metal complex.

21. The printing plate precursor according to claim 7 wherein the oleophilic polymer comprises carboxylic acid groups, the hydrophilic polymer comprises hydroxy groups and said crosslinker is a zirconium (IV) salt or metal complex.

22. The printing plate precursor according to claim 1 in which the functional groups are selected from the group consisting of —COOH groups, —OH groups and a combination thereof.

23. A process for producing a negative-working radiation imageable lithographic printing plate precursor comprising in order:
   (a) applying to a substrate an oleophilic base layer comprising an oleophilic polymer containing functional reactive groups, and a photothermal converter;
   (b) applying over said oleophilic base layer a hydrophilic top layer to form a layered composition, said top layer comprising a crosslinkable hydrophilic polymer capable of, interlayer chemical bonding with the reactive groups of said oleophilic polymer in the base layer;
   (c) overall exposing said layered composition to energy sufficient to crosslink said hydrophilic polymer, thereby forming crosslinked hydrophilic polymer, and to interlayer chemically bond said hydrophilic polymer with the functional reactive groups of the oleophilic polymer in the base layer to provide an interlayer adhesive bond between said top layer and said base layer.

24. The process of claim 23, in which said oleophilic polymer in said base layer is interlayer covalently bonded with said hydrophilic polymer in said overlying layer.

25. The process of claim 23, in which said energy is thermal energy.

26. The process of claim 23 in which said photothermal converter absorbs infrared radiation.

27. The process of claim 23 in which said photothermal converter is a cyanine dye.

28. The process of claim 23 in which said hydrophilic layer is free of a photothermal converter.

29. The process of claim 23 in which said crosslinked hydrophilic polymer is formed from a crosslinkable hydrophilic polymer and a crosslinking agent.

30. The process of claim 29 wherein said crosslinking agent is further reactive with said functional reactive groups of said oleophilic polymer.

31. The process of claim 23 in which the printing plate precursor is free of additional layers.

32. The process according to claim 23 in which the oleophilic polymer of the base layer is an organic polymer or mixture of organic polymers.

33. The process according to claim 23 in which the crosslinkable hydrophilic polymer of the overlayer is an organic polymer or mixture of organic polymers.

34. The process of claim 32 in which the oleophilic polymer is selected from the group consisting of acrylic polymers and copolymers, methacrylic polymers and copolymers, epoxy polymers, phenolic polymers, polyurethanes, polyureas, polyesters and combinations thereof.

35. The process of claim 32 in which the oleophilic polymer is selected from the group consisting of acrylic polymers and copolymers, methacrylic polymers and copolymers, polyurethanes and combinations thereof.

36. The process according to claim 35 in which the oleophilic polymer contains at least one carboxylic acid group.

37. The process according to claim 33 in which said crosslinkable hydrophilic polymer is selected from the group consisting of hydroxy-functional polymers, carboxylic acid-functional polymers, sulfonic acid-functional polymers, amido-functional polymers and sulfonamido-functional polymers.

38. The process according to claim 37 in which the hydroxy-functional polymer is selected from the group consisting of polyvinyl alcohol, a silanol-functional polyvinyl alcohol, a methacrylamino-functional polyvinyl alcohol, a sulfate-functional polyvinyl alcohol, an acrylic polymer, a methacrylic polymer, a polyester and a mixture thereof.

39. The process according to claim 37 in which the carboxylic acid-functional polymer is selected from the group consisting of polyacrylic acid, polymethacrylic acid, copolymers thereof and mixtures thereof.

40. The process according to claim 37 in which the amido functional polymer is selected from the group consisting of polyacrylamide, polymethacrylamide, copolymers thereof and mixtures thereof.

41. The process according to claim 29 in which said crosslinking agent is selected from the group consisting of polyvalent metal salts, polyvalent metal complexes, amino resin-crosslinking agents, amino resin-crosslinking agents, aldehyde-crosslinking agents, alkoxysilane-crosslinking agents and combinations thereof.

42. The process according to claim 41 in which said polyvalent metal salt or said polyvalent metal complex contains a metal selected from the group consisting of magnesium, aluminum, calcium, titanium, ferrous, cobalt, copper, strontium, zinc, zirconium, stannous and stannic.

43. The process according to claim 42 in which said polyvalent metal salt or said polyvalent metal complex is a zirconium (IV) salt or metal complex.

44. The process according to claim 30 wherein the oleophilic polymer comprises carboxylic acid groups, the hydrophilic polymer comprises hydroxy groups and said crosslinker is a zirconium (IV) salt or complex.

45. The process according to claim 23 in which the functional groups are selected from the group consisting of —COOH groups, —OH groups and combinations thereof.

46. A process for producing a negative-working lithographic printing plate comprising in order:
   (a) applying to a substrate an oleophilic base layer comprising an oleophilic polymer containing functional reactive groups, and a photothermal converter;
   (b) applying over said oleophilic base layer a hydrophilic top layer to form a layered composition, said top layer comprising a crosslinkable hydrophilic polymer capable of interlayer chemical bonding with the reactive groups of said oleophilic polymer in the base layer;
   (c) overall exposing said layered composition to energy sufficient to crosslink said hydrophilic polymer and to interlayer chemically bond said hydrophilic polymer with the functional reactive groups of the oleophilic polymer in the base layer to provide an interlayer adhesive bond between said top layer and said base layer;

(d) imagewise exposing said printing plate precursor to laser radiation to produce exposed and unexposed areas, whereby said interlayer adhesive bond is non-ablatively selectively weakened in radiation-exposed areas to provide an imaged printing plate precursor;

(e) mounting said imaged printing plate precursor on a lithographic printing press; and (f) contacting said plate precursor with fountain solution and ink so that said hydrophilic top layer is removed in said imagewise exposed areas to reveal the oleophilic base layer, while retaining the interlayer adhesive bond between the base layer and the hydrophilic top layer in said unexposed areas.

47. The process according to claim 46 in which the imaged printing plate precursor is contacted with an aqueous solution prior to mounting on said press.

\* \* \* \* \*

UNITED STATES PATENT AND TRADEMARK OFFICE
CERTIFICATE OF CORRECTION

PATENT NO. : 6,720,130 B1
DATED : April 13, 2004
INVENTOR(S) : Xing-Fu Zhong et al.

It is certified that error appears in the above-identified patent and that said Letters Patent is hereby corrected as shown below:

Title page,
Insert Item -- [65]  Prior Publication Data
US 2004/0067439 A1   April 8, 2004 --

Signed and Sealed this

Thirtieth Day of November, 2004

JON W. DUDAS
*Director of the United States Patent and Trademark Office*